United States Patent
Chiu et al.

(10) Patent No.: US 6,391,683 B1
(45) Date of Patent: May 21, 2002

(54) FLIP-CHIP SEMICONDUCTOR PACKAGE STRUCTURE AND PROCESS FOR FABRICATING THE SAME

(75) Inventors: Shih-Kuang Chiu, Taichung; Ying-Chou Tsai, Hsin Chu, both of (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 09/599,026

(22) Filed: Jun. 21, 2000

(51) Int. Cl.[7] .......................... H01L 21/58; H01L 21/56
(52) U.S. Cl. ..................... 438/108; 438/106; 438/121; 257/678; 257/684
(58) Field of Search .................... 438/107, 108, 438/127, 106, 121, 124

(56) References Cited

U.S. PATENT DOCUMENTS 5,227,663 A * 7/1993 Patil et al. ................ 257/718
6,020,221 A    2/2000 Lim et al.
6,228,679 B1 * 5/2001 Chiu ........................ 438/108
6,245,583 B1 * 6/2001 Amador et al. ............ 438/14

* cited by examiner

*Primary Examiner*—John F. Niebling
*Assistant Examiner*—Scott B. Geyer
(74) *Attorney, Agent, or Firm*—Peter F. Corless; Steven M. Jensen; Edwards & Angell, LLP

(57) ABSTRACT

An advanced flip-chip packaging technology is proposed, which is characterized in the forming of a metal dam over the substrate to serve three different utilization purposes. First, the metal dam can help provide a specific fillet width to the underfilled material under the flip chip so as to allow the joint between the flip chip and the substrate to have increased robustness against thermal stress. Second, the metal dam can serve as a mechanical reinforcement to the substrate to prevent package warpage. Third, the metal dam can additionally serve as a heat-dissipation structure to help the beat dissipation from the flip chip. These benefits allow the finished package product to be highly assured in quality and reliability.

7 Claims, 3 Drawing Sheets

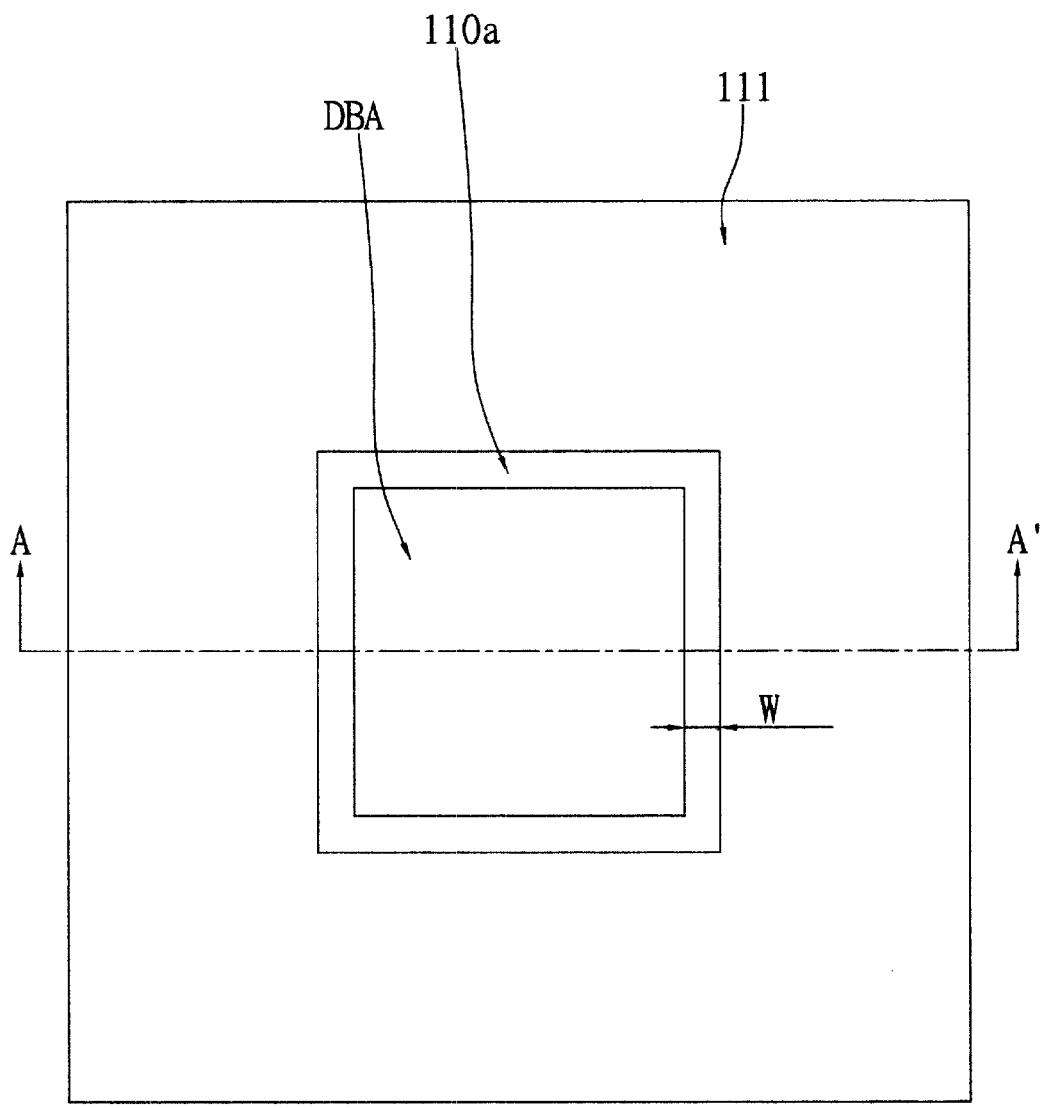

FLIP-CHIP SEMICONDUCTOR PACKAGE STRUCTURE AND PROCESS FOR FABRICATING THE SAME

BACKGROUND OF THE INVENTION

1. Field of the Invention

This invention relates to semiconductor packaging technology, and more particularly, to a flip-chip semiconductor packaging technology that can be used for the fabrication of a flip-chip package structure having increased structural robustness to prevent package warpage as well as having increased heat-dissipation efficiency.

2. Description of Related Art

The flip-chip packaging technology is an advanced semiconductor packaging technology which differs from conventional technology particularly in that the chip is mounted in an upside-down manner over the substrate and electrically coupled to the same by means of the ball-grid array (BGA) technology. After the flip chip is readily bonded in position, however, a gap would be undesirably left between the chip and its underlying surface, which, if not underfilled, would easily cause the flip chip to suffer from fatigue cracking and electrical failure due to thermal stress when the entire package structure is being subjected to high-temperature conditions. As a solution to this problem, it is an essential step in flip-chip package fabrication to fill an underfill material, such as resin, into such a gap. The underfilled resin, when hardened, can serve as a mechanical reinforcement for the flip chip to cope against thermal stress. The involved fabrication process is customarily referred to as flip-chip underfill. A conventional flip-chip package fabrication process is briefly depicted in the following with reference to FIGS. 1A–1B.

Referring to FIG. 1A, by the conventional process, the first step is to prepare a substrate 10, which is typically made of an organic material. Next, a semiconductor chip 20 is mounted in a flip-chip manner over the substrate 10, and which is mechanically bonded and electrically coupled to the substrate 10 by means of a plurality of solder balls 30. Due to the existence of these solder balls 30, however, a gap 20a is undesirably left under the flip chip 20. This gap 20a, if not underfilled, would easily cause the flip chip 20 to suffer from fatigue cracking and electrical failure due to thermal stress when the entire package structure is being subjected to high-temperature conditions during subsequent fabrication steps.

Referring further to FIG. 1B, as a solution to the foregoing problem, a dispensing needle 40 is used to dispense an underfill material, such as resin 41, onto the substrate area beside the gap 20a. The dispensed resin 41 will then fill into the gap 20a through capillary action. After the underfill process is finished, however, the underfilled resin 41 would have a fillet part 41a spread beyond the gap 20a. The width of this underfill fillet part 41a is roughly proportional to the height of the gap 20a under the chip 20 and the amount of the dispensed resin 41, as depicted in the following with reference to FIGS. 2A–2B.

FIG. 2A shows the case of the chip 20 having a gap height of $H_1$ and an underfill fillet width of $W_1$, while FIG. 2B shows the case of the chip 20 having a gap height of $H_2$ and an underfill fillet width of $W_2$; if $H_1<H_2$, then $W_1<W_2$. This means that the conventional flip-chip package fabrication process, when utilized with various package sizes, would result in different underfill fillet widths. During the fabrication process, if the underfill fillet width is overly small or overly large, it would all make the flip chip 20 and the substrate 10 easily subjected to warpage due to thermal stress and would thus degrade the quality and reliability of the finished package product.

In view of the foregoing drawback, there exists a need for a new flip-chip package fabrication process that can help the fillet part of the underfilled resin to be fixed to a specific width irrespective of the height of the flip chip's underneath gap.

Beside the fillet-width problem, conventional flip-chip package structures would suffer from package warpage due to the substrate being made of organic material which is typically flexible. A solution to this problem is disclosed in the U.S. Pat. No. 6,020,221 entitled "PROCESS FOR MANUFACTURING A SEMICONDUCTOR DEVICE HAVING A STIFFENER MEMBER". This patent discloses the use of a stiffener member attached to the substrate, which not only can serve as a mechanical reinforcement for the substrate to prevent package warpage, but also can serve as a heat-dissipation means to dissipate the chip-produced heat during active operation. This patent, however, is not useful to provide a specific underfill fillet width, and would be therefore still easily subjected to package warpage when the underfill fillet width is made overly small or overly large.

SUMMARY OF THE INVENTION

It is therefore an objective of this invention to provide a new flip-chip packaging technology, which allows the underfilled resin underneath the flip chip to have a predetermined fixed underfill fillet width.

It is another objective of this invention to provide a new flip-chip packaging technology, which can provide additional mechanical reinforcement to the substrate so as to allow the package structure to be more robust to prevent package warpage.

It is still another objective of this invention to provide a new flip-chip packaging technology, which allow the flip-chip package structure to have increased heat-dissipation efficiency.

In accordance with the foregoing and other objectives, the invention proposes a new flip-chip packaging technology.

The flip-chip packaging technology of the invention provides a new package structure which, broadly defined, comprises the following constituent parts: (a) a substrate; (b) a semiconductor chip mounted over the substrate through flip-chip technology, with a gap existing between the semiconductor chip and the substrate; (c) a metal dam formed around the semiconductor chip over the substrate, the metal dam being dimensioned to a predetermined thickness and separated from the semiconductor chip by a fillet area of a predetermined width, and (d) an underfill layer formed in the gap under the semiconductor chip, the underfill layer having a fillet part lying over the fillet area.

Moreover, the flip-chip packaging technology of the invention provides a new package fabrication process which comprises the following procedural steps: (1) preparing a substrate having a center area predefined as a die-bonding area; (2) forming a metal dam around the die-bonding area over the substrate, the metal dam being dimensioned to a predetermined thickness and separated from the die-bonding area by a fillet area of a predetermined fillet width; (3) mounting a semiconductor chip onto the die-bonding area over the substrate through flip-chip technology, and in which process a gap is undesirably left between the semiconductor chip and the substrate, and (4) dispensing an underfill material onto the fillet area; the dispensed underfill material subsequently filing into the gap between the semiconductor chip and the substrate through capillary action, thereby forming an underfill layer having a fillet part over the fillet area, with the width of the fillet part being substantially equal to the predetermined width of the fillet area.

It is a characteristic feature of the invention that the metal dam alone can serve three different utilization purposes. First, the metal dam can help provide a specific fillet width to the underfill layer under the flip chip so as to allow the joint between the flip chip and the substrate to have increased robustness against thermal stress. Second, the metal dam can serve as a mechanical reinforcement to the substrate to prevent package warpage. Third, the metal dam can additionally serve as a heat-dissipation structure to help heat dissipation from the flip chip. These benefits allow the finished package product to be highly assured in quality and reliability.

BRIEF DESCRIPTION OF DRAWINGS

The invention can be more fully understood by reading the following detailed description of the preferred embodiments, with reference made to the accompanying drawings, wherein:

FIG. 4 is a schematic top view of the package structure shown in FIG. 3A.

DETAILED DESCRIPTION OF PREFERRED EMBODIMENTS

A preferred embodiment of the flip-chip packaging technology of the invention is disclosed in full details in the following with reference to FIGS. 3A–3D and FIG. 4.

Figure 1A:
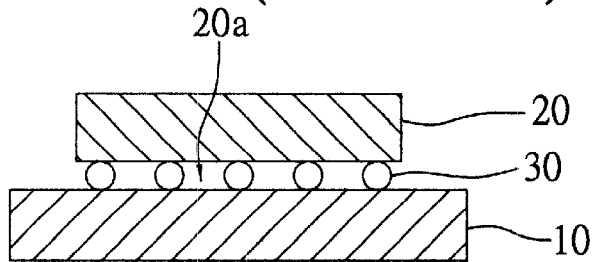
FIGS. 1A–1B (PRIOR ART) are schematic sectional diagrams used to depict a conventional process for fabricating a flip-chip package.
Figure 1B:
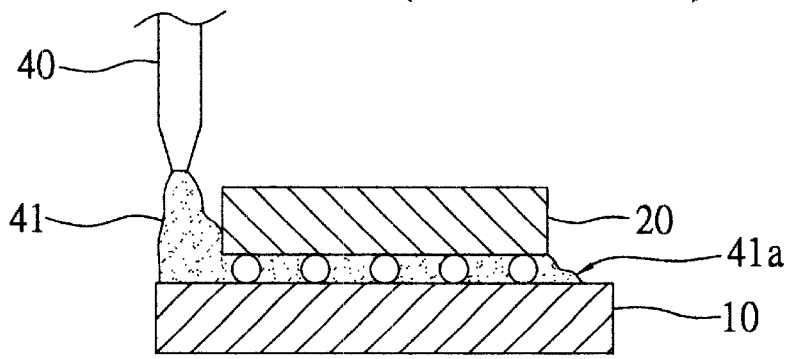
Figure 2A:
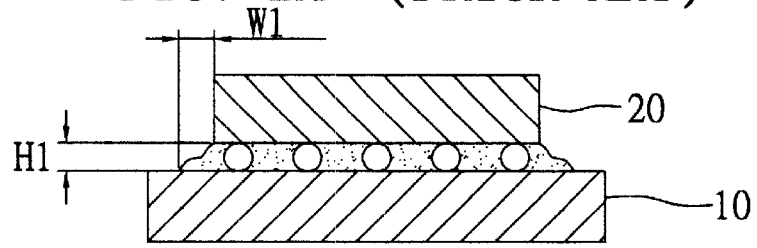
FIGS. 2A–2B (PRIOR ART) are schematic sectional diagrams used to depict the problem of an inconsistent underfill fillet width when utilizing the conventional flip-chip packaging technology.
Figure 2B:
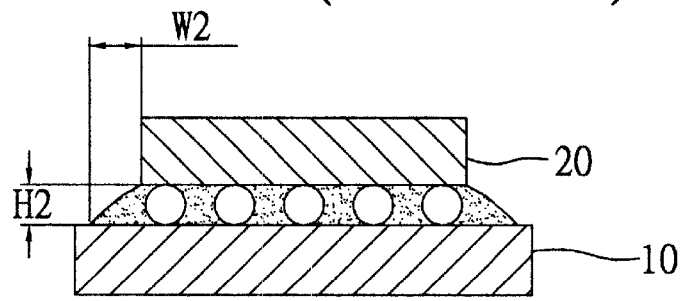
Figure 3A:
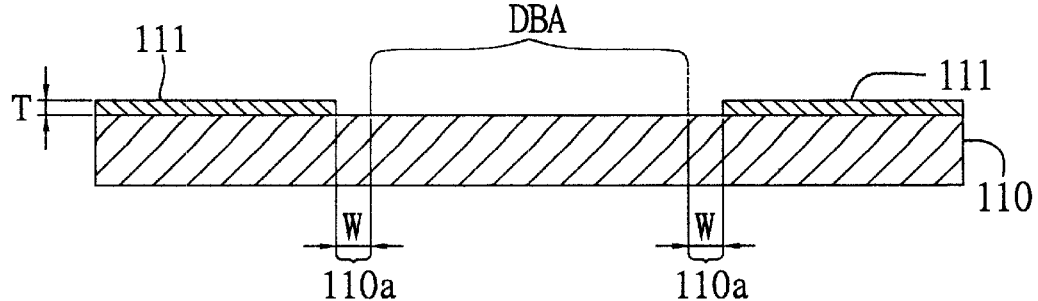
FIGS. 3A–3D are schematic sectional diagrams used to depict the package structure and fabrication steps according to the flip-chip packaging technology of the invention.

Referring to FIG. 3A together with FIG. 4, by the flip-chip package fabrication process of the invention, the first step is to prepare a substrate 110, such as an organic substrate. The substrate 110 has a center area predefined as a die-bonding area DBA. Subsequently, a metal dam 111 is formed around the die-bonding area DBA over the substrate 110 to a predetermined thickness T, preferably from 5 $\mu$m to 70 $\mu$m (micrometer), and separated from the boundary of the die-bonding area DBA by a predetermined fillet width W, preferably from 0.5 mm to 2.5 mm (millimeter). The blank area between the metal dam 111 and the flip chip 120 is referred to as a fillet area 110a.

Figure 3B:
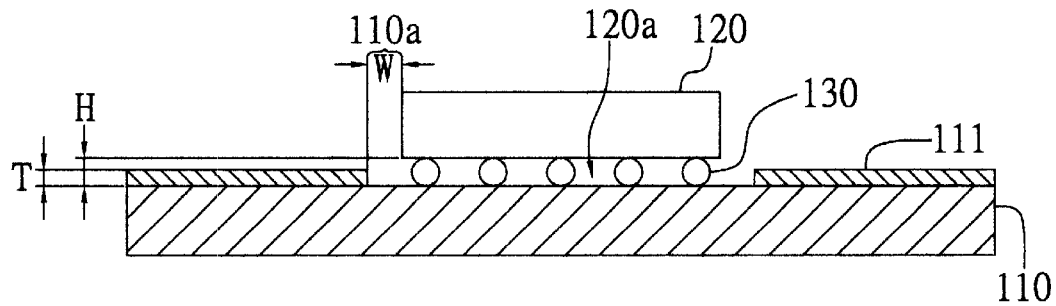

Referring further to FIG. 3B, in the next step, a semiconductor chip 120 is mounted in a flipped manner directly on the die-bonding area DBA over the substrate 110 and which is electrically coupled to the substrate 110 by means of a plurality of solder balls 130. Due to the existence of the solder balls 130, however, a gap 120a having a height H is undesirably left under the flip chip 120. It is to be noted that, during the fabrication of the metal dam 111 in the previous step, the thickness T of the metal dam 111 should be smaller than the height H of the gap 120a under the flip chip 120; otherwise, it would obstruct the cleaning of the package body after subsequent flip-chip bonding process.

Figure 3C:
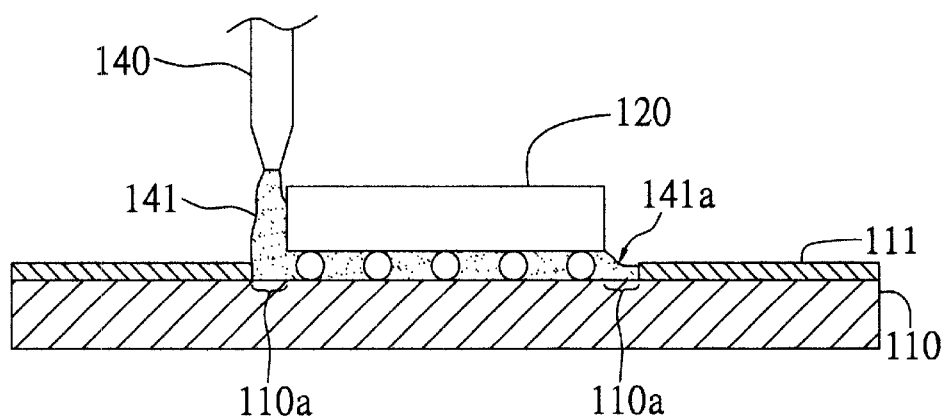

Referring further to FIG. 3C, in the next step, a dispensing needle 140 is used to dispense a predetermined amount of an underfill material, such as resin 141, onto the fillet area 110a between the metal dam 111 and the flip chip 120. The dispensed resin 141 will then fill into the gap 120a under the flip chip 120 through capillary action. During the underfill process, thanks to the provision of the metal dam 111, the dispensed resin 141 would be confined within the fillet area 110a to flow only toward the gap 120a under the flip chip 120 without flashing to other areas on the substrate 110. After the underfill process is completed, the underfilled resin 141 would include a fillet part 141a over the fillet area 110a. Owing to the provision of the metal dam 111, the fillet part 141a of the underfilled resin 141 would have a fixed width substantially equal to the predefined width W of the fillet area 110a.

It is a characteristic feature of the invention that the metal dam 111 alone can serve three different utilization purposes. First, it can provide the above-mentioned confining effect to the dispensed resin 141 for the defining of a fixed fillet width. Second, since metal is typically much stiffer than organic substance, the metal dam 111 can serve as a mechanical reinforcement to the organic substrate 110, allowing the entire package structure to be more robust to prevent package warpage. Third, since metal is typically thermally conductive, the metal dam 111 can additionally serve as a heat-dissipation structure to help dissipate the heat produced by the flip chip 120 during active operation.

Figure 3D:
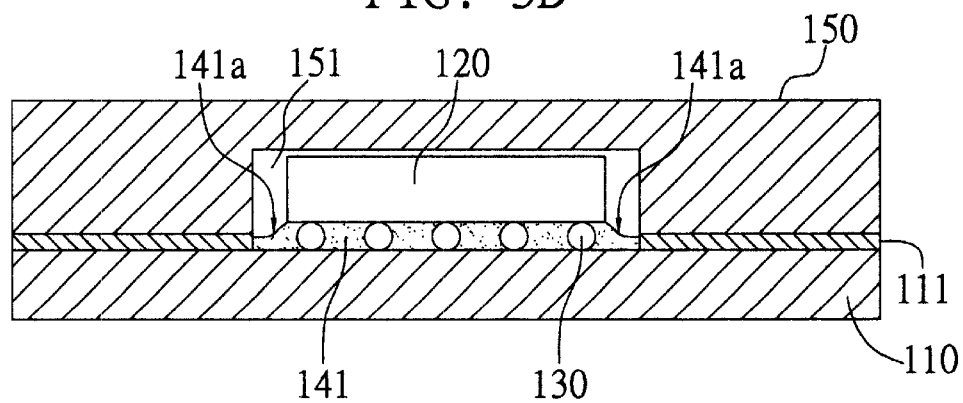

Referring further to FIG. 3D, in order to help further increase the efficiency of heat dissipation from the flip chip 120, a heat sink 150 having a recessed portion 151 can be additionally mounted over the metal dam 111, with the recessed portion 151 thereof accommodating the flip chip 120. This provision allows the total heat-dissipation surface on the package structure to be increased.

In conclusion, the invention provides a new flip-chip packaging technology which is characterized in the use of a metal dam capable of serving three utilization purposes: (1) providing a specific fillet width to allow the joint between the flip chip and the substrate to have optimal resistance against thermal stress; (2) serving as a mechanical reinforcement to the substrate to prevent package warpage; and (3) serving as a heat-dissipation structure to help heat dissipation from the flip chip. These benefits allow the finished package product to be highly assured in quality and reliability. The invention is therefore more advantageous to use than the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor package fabrication process, comprising the steps of:
   (1) preparing a substrate having a center area predefined as a die-bonding area;
   (2) forming a metal dam around the die-bonding area over the substrate, the metal dam being dimensioned to a predetermined thickness of from 5 $\mu$m to 70 $\mu$m and separated from the die-bonding area by a fillet area of a predetermined fillet width of from 0.5 mm to 2.5 mm;
   (3) mounting a semiconductor chip onto the die-bonding area over the substrate through flip-chip technology, and in which process a gap is undesirably left between the semiconductor chip and the substrate; and (4) dispensing an underfill material onto the fillet area, the dispensed underfill material subsequently filling into the gap between the semiconductor chip and the substrate through capillary action, thereby forming an underfill layer having a fillet part over the fillet area, with the width of the fillet part being substantially equal to the predetermined width of the fillet area.

2. The semiconductor package fabrication process of claim 1, further comprising the step of:

(5) mounting a heat sink having a recessed portion over the metal dam, with the recessed portion thereof accommodating the semiconductor chip.

3. The semiconductor package fabrication process of claim 1, wherein in said step (2), the predetermined thickness of the metal dam is smaller than the height of the gap between the semiconductor chip and the substrate.

4. The semiconductor package fabrication process of claim 1, wherein in said step (4), the underfill material is resin.

5. A semiconductor package fabrication process, comprising the steps of:

(1) preparing a substrate having a center area predefined as a die-bonding area;

(2) forming a metal dam around the die-bonding area over the substrate, the metal dam being dimensioned to a predetermined thickness of from 5 $\mu$m to 70 $\mu$m and separated from the die-bonding area by a fillet area of a predetermined fillet width of from 0.5 mm to 2.5 mm;

(3) mounting a semiconductor chip onto the die-bonding area over the substrate through flip-chip technology, and in which process a gap is undesirably left between the semiconductor chip and the substrate;

(4) dispensing an underfill material onto the fillet area, the dispensed underfill material subsequently filling into the gap between the semiconductor chip and the substrate through capillary action, thereby forming an underfill layer having a fillet part over the fillet area, with the width of the fillet part being substantially equal to the predetermined width of the fillet area; and (5) mounting a heat sink having a recessed portion over the metal dam, with the recessed portion thereof accommodating the semiconductor chip.

6. The semiconductor package fabrication process of claim 5, wherein in said step (2), the predetermined thickness of the metal dam is smaller than the height of the gap between the semiconductor chip and the substrate.

7. The semiconductor package fabrication process of claim 5, wherein in said step (4), the underfill material is resin.

* * * * *